United States Patent [19]

Sioshansi et al.

[11] Patent Number: 5,236,509
[45] Date of Patent: Aug. 17, 1993

[54] MODULAR IBAD APPARATUS FOR CONTINUOUS COATING

[75] Inventors: Piran Sioshansi, Lincoln; Raymond J. Bricault, Jr., Worcester, both of Mass.

[73] Assignee: Spire Corporation, Bedford, Mass.

[21] Appl. No.: 832,019

[22] Filed: Feb. 6, 1992

[51] Int. Cl.$^5$ ............................................. C23C 16/54
[52] U.S. Cl. .................................. 118/719; 118/718; 204/298.25
[58] Field of Search .................. 204/298.25; 118/718, 118/719

[56] References Cited

U.S. PATENT DOCUMENTS

| | | | |
|---|---|---|---|
| 4,039,699 | 8/1977 | Morimoto et al. | 427/38 |
| 4,152,478 | 5/1979 | Takagi | 428/221 |
| 4,281,029 | 7/1981 | Takagi et al. | 427/38 |
| 4,440,108 | 4/1984 | Little et al. | 118/719 |
| 4,443,488 | 4/1984 | Little et al. | 427/38 |
| 4,622,919 | 11/1986 | Suzuki et al. | 118/718 |
| 4,683,149 | 9/1987 | Suzuki et al. | 427/38 |
| 4,693,760 | 9/1987 | Sioshansi | 148/4 |
| 4,743,308 | 5/1988 | Sioshansi et al. | 148/4 |
| 4,743,493 | 5/1988 | Sioshansi et al. | 428/217 |
| 4,855,026 | 8/1989 | Sioshansi | 204/192.11 |
| 4,872,922 | 10/1989 | Bunker et al. | 148/4 |
| 4,911,810 | 3/1990 | Lauro et al. | 204/192.12 |
| 5,080,455 | 1/1992 | King et al. | 359/350 |

OTHER PUBLICATIONS

R. J. Bricault et al., "Deposition of Boron Nitride Thin Films by Ion Beam Assisted Deposition", *Nuclear Instruments and Methods in Physics Research* B21 (1987) pp. 586–587.
T. G. Tetreault et al., "The Friction and Wear Behavior of Ion Beam Assisted Nitride Coatings," *Mat. Res. Soc. Symp. Proc.*, vol. 128 (1989) p. 439.
Ih-Houng Loh et al., "The Promotion of Metal/Polymer Adhesion by Ion Beam Enhanced Deposition" *Mat. Res. Soc. Symp. Proc. 108*, 241 (1987).
W. D. Halverson et al., "Ion Assisted Synthesis of Boron Nitride Coatings" *Nat. Sci. Forum vol. 54–55* (1990) pp. 71–110.
D. R. Brighton, et al. "Binary Collision Cascade Prediction of Critical Ion-To-Atom Arrival Ratio in the Production of Thin Films With Reduced Intrinsic Stress" *Nucl. Instr. and Meth. Phys. Res.* B28 (1987) 527–533.
L. Kempfer "Getting Skin Deep With Ion Beams," *Medical Electronics*, Apr. 1990, pp. 29–32.
E. H. Hirsch et al. "The Effect of Ion Irradiation on the Adherence of Germanium Films" *Thin Solid Films* 52 (1978) 445–452.
R. Messier et al. "Revised Structure Zone Model for Thin Film Physical Structure" *J. Vac. Sci Technol.* A2(2) Apr.–Jun. 1984 pp. 500–503.

*Primary Examiner*—Aaron Weisstuch
*Attorney, Agent, or Firm*—Morse, Altman, Dacey & Benson

[57] ABSTRACT

A modular ion beam assisted continuous coating apparatus and method for a wide range of materials and the products so made are disclosed. The materials include metals, such as all kinds of steels and the like in sheet, wire, tubing and rod forms, and plastics, such as all kinds of polymers again in sheet, wire, tubing and rod forms. The coatings on the materials are intended to improve their wear, corrosion and/or oxidation resistance as well as to enhance their aesthetic appearance. The coatings essentially include metals such as aluminum, chromium, cadmium, tin, zinc, iron, platinum, nickel, silver, gold, etc., and ceramics such as $ZrO_2$, $SiO_2$, $Y_2O_3$, TiN and $Si_3N_4$. The modular continuous coating apparatus essentially is divided into four stages a vacuum entry stage, a material pre-cleaning stage, an ion beam assisted coating stage, and a vacuum exit stage. Each stage and all operative components thereof are modular in design, such that any one stage or component can be removed and modified or repaired without the need of arresting the operation of the continuous coating apparatus.

27 Claims, 5 Drawing Sheets

MODULAR IBAD APPARATUS FOR CONTINUOUS COATING

BACKGROUND OF THE INVENTION

1. Field of the Invention

The present invention relates generally to continuous coating method and apparatus and, more particularly, to a modular ion-beam-assisted-deposition (IBAD) apparatus and method for the continuous coating of a wide range of materials, and products so made.

2. The Prior Art

Industry, in particular the steel industry, employs a great number of surface treatments and coatings for their products. The surface treatments and coatings are designed primarily to improve the products' wear, corrosion and/or oxidation resistance, and in some applications, their aesthetic appearance as well. In the steel industry, low carbon steels (steels with carbon content ranging from about 0.002 to about 0.09 percent) constitute the majority of steels currently in production for continuous sheet material Most of these are flat products where the thickness of the sheet steel is from about 0.3 mm to about 2.0 mm and is typically produced as a cold rolled steel. Such flat steel sheet products are required in large volumes, inter alia, by the automotive industry, where corrosion and oxidation resistance are of principal concern. Zinc and cadmium coatings applied to one or both sides of the flat steel sheets are preferred to improve their corrosion and/or oxidation resistance.

Presently, such coatings to flat steel sheets are applied either by bath plating or electroplating techniques. They are high volume, low cost processes. Changing from zinc coating to another type of coating presents considerable difficulties and expense, however. Additionally, there is currently significant governmental and/or environmental market pressure to switch, wherever possible, to alternate methods of coating flat steel sheets with materials. First, toxic waste generated by the bath and electroplating techniques should be eliminated or at least substantially reduced. Second, there is a need for higher performance coatings, particularly regarding qualities of adhesion, microstructure, uniformity and reproducibility of the coatings as between successive batches. Third, there is a need to improve production efficiency by eliminating or reducing waste, a characteristic of the bath and electroplating processes.

Another large area of utilization for flat steel sheet products in preferred thicknesses from about 0.1 mm to about 0.3 mm include their use as cans and for food packagings. For use in cans, for instance, the steel sheet first is dip-plated, preferably with a tin coating in the range of 2 to 4 microns and then a polymer coating is applied thereto.

Aside from the above "flat" products, steel products requiring coatings include "long" products formed in bar, rod or extrusion forms and comprise such items as I-beams, H-beams, railway extrusions and reinforcement rods used in construction. Then there are the low carbon steel wires and springs used as nuts, bolts, general wire, and various kinds of springs. Coatings thereto presently are generally applied by phosphidation or other conversion coating processes with or without also applying a polymer coating to anchor the phosphide coating, which has a tendency to flake off.

High carbon steels (with carbon content in excess of about 0.1 percent) are employed, inter alia, as tool steels for cutting, slicing, scoring, dicing, milling, and other mechining applications. Coatings such as, of titanium nitride and aluminum oxide, usually are applied with an adhesive layer to strengthen adhesion.

The deposition of boron nitride as well as other refractory nitride thin film coatings on various substrates by ion beam assisted deposition (IBAD) is already known. See R. J. Bricault et al., "Deposition of Boron Nitride Thin Films by Ion Beam Assisted Deposition," *Nuclear Instruments & Methods in Physics Research B*21, (1987) pp. 586–587; and T. G. Tetroult et al., "The Friction and Wear Behavior of Ion Beam Assisted Nitride Coatings,"*Mat. Res. Soc. Symp. Proc., vol* 128 (1989), pg. 439.

Ion implantation has been employed in the preparation of phosphor (U.S. Pat. No. 4,039,699), in the deposition of ionized clusters on substrates (U.S Pat. No. 4,152,478), and in the method of coating with a stoichiometric compound (U.S. Pat. No. 4,281,029). The common assignee herein, Spire Corporation of Bedford, Mass., has been one of the pioneers in working with ion beams. For instance, among thers it has patented an ion beam coating apparatus (U.S. Pat. No. 4,440,108), a plasma ion deposition process (U.S. Pat. No. 4,443,488), a process for preventing surface discoloration in orthopaedic implants (U.S. Pat. No. 4,693,760), a process for the ion implantation of plastics (U.S. Pat. No. 4,743,493), a process of treating metal alloys to inhibit corrosion (U.S. Pat. No. 4,743,308), a sputter-enhanced ion implantation process (U.S. Pat. No. 4,855,026), and a method and apparatus for ion implanting spherical surfaces (U.S. Pat. No. 4,872,922). In each of these methods, the apparatus employed has been one capable for batch-processing only. A continuous on-line coating apparatus employing ion beam technology would speed up processing and reduce costs, thereby provide access to high volume, large area products.

SUMMARY OF THE INVENTION

It is a principal object of the present invention to overcome the above disadvantages by providing a continuous on-line coating apparatus and method which is both modular and involves ion-beam-assisted-deposition (IBAD), and products so made.

More particularly, it is an object of the present invention to provide a modular IBAD apparatus and method for the continuous coating of a wide range of materials including metals, preferably steels, and polymers, whether in sheet, wire, tubing, or rod forms. The coatings on the materials are intended to improve the wear, corrosion and/or oxidation resistance of the treated materials and, in some instances, also to enhance their aesthetic appearance. The coatings primarily include metals such as aluminum, chromium, cadmium, tin, zinc, platinum, nickel, $Y_2YO_3$, silver, gold, etc., and ceramics such as $ZrO_2$, $SiO_2$, TiN and $Si_3N_4$, and the like.

The modular continuous coating apparatus essentially comprises a vacuum entry stage, a material pre-cleaning stage, an ion beam assisted (IBAD) coating stage, and a vacuum exit stage. Each stage and all operative components thereof are modular in design, such that any one stage or component can be removed, modified, or repaired without the need of arresting the operation of the continuous coating apparatus, or changed in the nature and/or type of film being deposited. Preferably, the vacuum entry stage comprises a multi-stage differentially pumped unit. Preferably, the pre-cleaning stage comprises a plurality of ion sources tandemly mounted and being independently operable Preferably, the IBAD coating stage comprises a plurality of IBAD modules, with each module having at least one ion source and an evaporation source, each independently operable The apparatus further includes a high vacuum pumping system comprising a plurality of independently operable pumps, each pump being individually valved to the apparatus along its own gate valve. Preferably, the apparatus is capable of processing material in sheet form at a rate of at least about 5 meters per minute, while applying a continuous, uniform coating of about 0.1 to about one microns per second thereto. The apparatus can conveniently be incorporated into an existing raw material production line, taking the sheet, wire, tubing, or rod material directly therefrom and proceed to pre-cleaning and coating the same. Preferably, the apparatus includes a central control station, together with support facilities and power supplies, all individually and independently coupled to each and/or every operational element of the apparatus.

The continuous coating process essentially comprises feeding a sheet of material into an apparatus including a plurality of modular IBAD modules, atomically cleaning at least one surface of the sheet of material, and dry-coating the cleaned surface with an alloy as the surface of the sheet is transported within the apparatus in operative association with the plurality of modular IBAD modules. The sheet of material can be formed of metal, such as steel, or of plastic. The alloy can be one or more metals or mixtures thereof or the alloy can comprise one or more ceramics. The dry-coated sheet can feature a plurality of layers of coatings of the same or different materials and of various thicknesses.

Other objects of the present invention will in part be obvious and will in part appear hereinafter.

The invention accordingly comprises the apparatus, product and method of the present disclosure, its components, parts and their interrelationship, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accompanying drawings, wherein.

DETAILED DESCRIPTION OF THE PREFERRED EMBODIMENT

In general, the present invention pertains to continuous coating apparatus and method of the kind in which a modular ion-beam-assisted-deposition (IBAD) system is employed for the continuous application of a uniform coating to a wide range of materials in an economical, reliable and reproducible manner. The materials to be coated by the modular IBAD system of the invention include metals, primarily steels of all types and composition, and polymer plastics, whether in sheet, wire, tubing, or rod forms. The coatings to be applied to these materials by the modular IBAD system of the invention are intended to improve their wear, corrosion and/or oxidation resistance and, for some applications, also to enhance the aesthetic appearance of the coated materials. The coating materials essentially include certain metals, such as aluminum, chromium, cadmium, tin, zinc, iron, platinum, nickel, $Y_2O_3$, silver, gold, etc., and certain ceramics such as $ZrO_2$, $SiO_2$, TiN and $Si_3N_4$.

The continuous coating process essentially comprises feeding a sheet of material into an apparatus including a plurality of modular IBAD modules, atomically cleaning at least one surface of the sheet of material, and dry-coating the cleaned surface with an alloy as the surface of the sheet is transported within the apparatus in operative association with the plurality of modular IBAD modules The sheet of material can be formed of metal, such as steel, or of plastic The alloy can be one or more metals or mixtures thereof or the alloy can comprise one or more ceramics The dry-coated sheet can feature a plurality of layers of coatings of the same or different materials and of various thicknesses.

As far as known, all currently used apparatus and methods employing ion beams for the processing of materials do so in batches or lots only. Hence, the processing tends to be non-uniform as between successive batches. Further, these present day apparatus are non-modular in design. Hence, if any one of a key component of the system goes off-line for any reason, then the entire system must be shut down and becomes inoperational. Further, these present day apparatus, employing ion beams for the processing of materials cannot be directly incorporated into existing raw material production lines but must be fed from the end products of such production lines.

Figure 1:
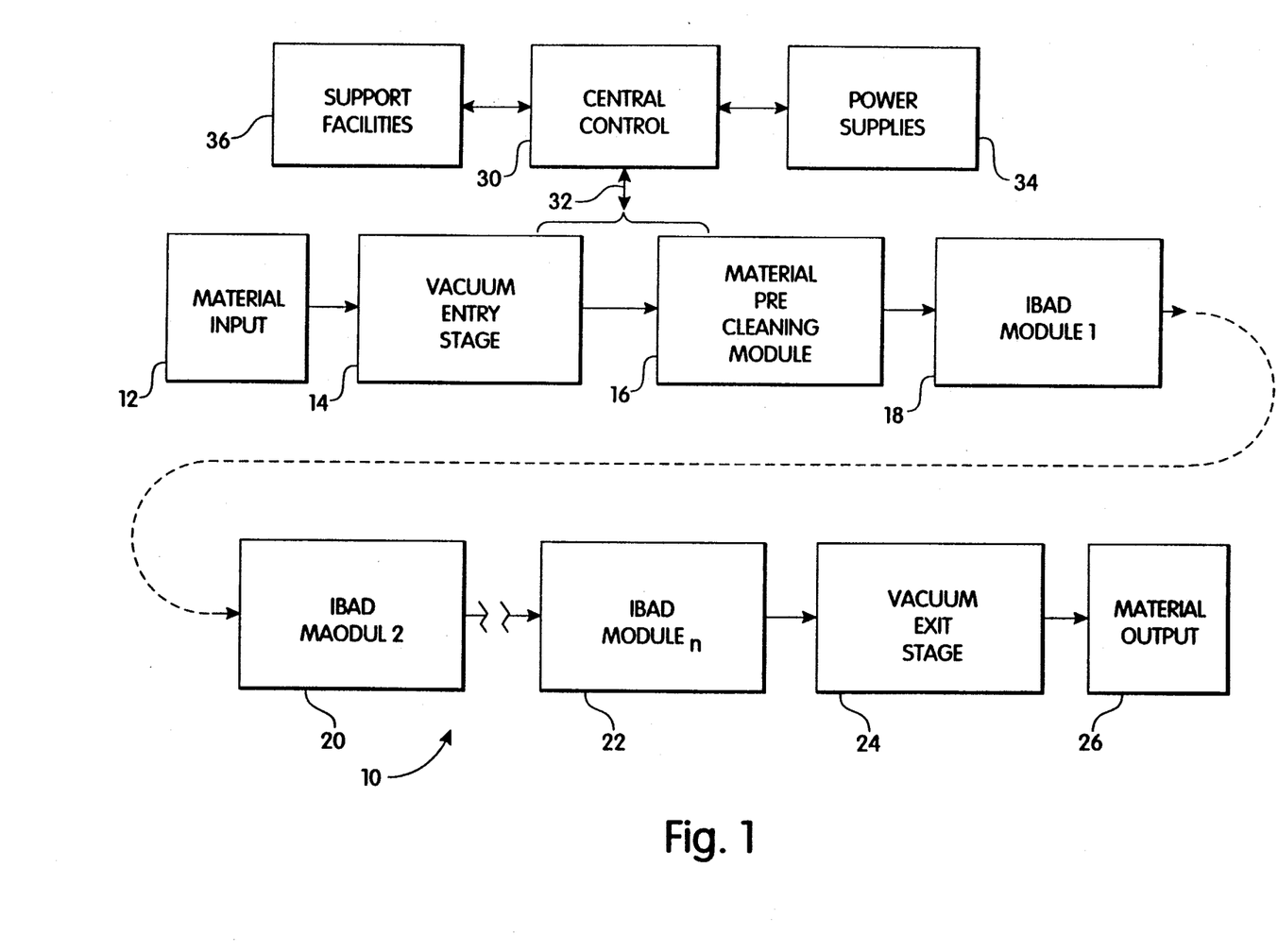
FIG. 1 is a block diagram of a modular IBAD apparatus for the continuous coating of materials according to the invention.

A modular IBAD apparatus 10 for the continuous coating of a wide range of materials is illustrated in a block diagram in FIG. 1. Essentially, the modular IBAD apparatus 10 of the invention comprises a material input section 12, a vacuum entry stage 14, a material pre-cleaning module 16, an ion-beam assisted coating stage comprising a plurality of IBAD modules 18, 20 and 22, a vacuum exit stage 24, and a material output section 26.

The modular IBAD apparatus 10 preferably is operated via a central control console 30 which is in two-way communication, as indicated by an arrow 32, with each and every one of the modular operative elements 12-26 of the IBAD apparatus 10. The central control console 30 includes a power "on-off" indicator and an indicator of the speed at which the material is being processed by the apparatus 10. A dedicated controller, including a control logistics system, does in turn convert the speed of the material into the required appropriate operational parameters for the respective elements 12-26, including the ion sources and the evaporator elements. The controller can comprise a microprocessor, a ladder logic, a relay logic, and/or any other suitable electronic controller. The central control console 30 preferably also includes a status indicator as to the overall functioning of the apparatus 10 and its respective operative elements 12-26. Thus, a single malfunctioning modular element can be immediately identified and, due to the modular construction of the apparatus 10, the malfunctioning element can be replaced and/or repaired without having to shut down the apparatus 10.

Linear material speed is automatically translated into the desired deposition rate to achieve the desired coating thickness. Most operational parameters preferably are pre-programmed into the central controller. Manual overrides via thumb-wheel settings also can form a part of the central control 30. A power supply source 34 is provided and made applicable, via the control console 30, to each and every operational element 12-26, in keeping with the modular design. Consequently, taking one or more of the operational elements 12-26 off the production line will not bring about a shut-down of the operation of the coating apparatus 10. The central control console 30, i.e., its microprocessor, also is designed to track the number of hours of continuous operational use of each and every one of the operational elements 12-26 and their components of the apparatus 10, their respective use of power and other consumables. Appropriate support facilities 36 also are provided, via the central control console 30, for each and every one of the modular operational elements 12-26 of the apparatus 10. Such support facilities 36 include vacuum support equipment, including compressors, water cooling and/or purification systems, filtration equipment, and the like.

Figure 10:
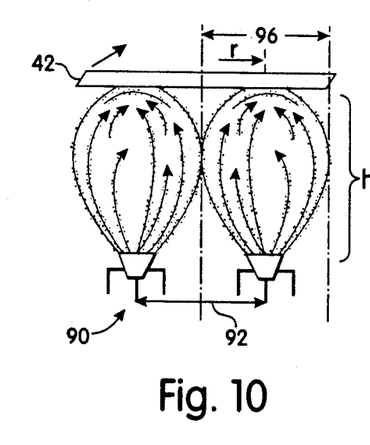
FIG. 10 illustrates in vertical section a two-point source crucible type evaporator.
Figure 11:
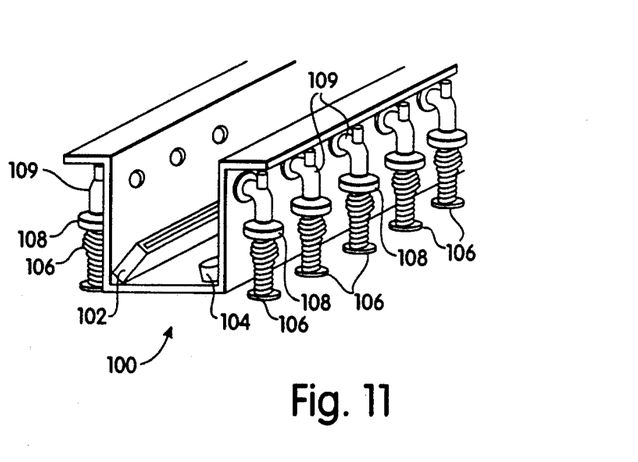
FIG. 11 is an isometric view, partly in section, illustrating a preferred layout for a high vacuum pumping system for the apparatus according to the invention.
Figure 12:
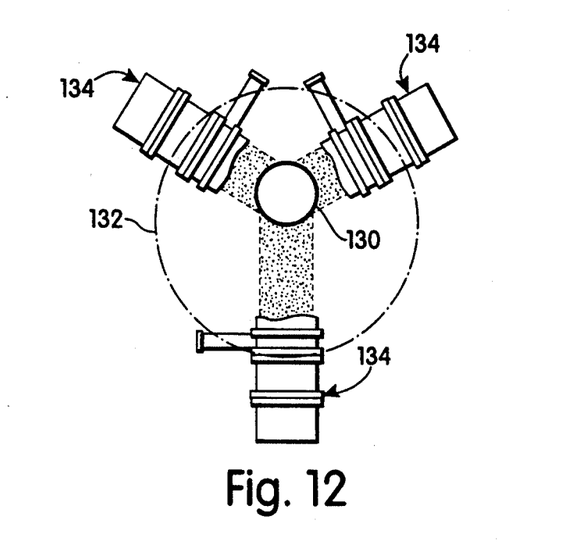
FIG. 12 is a vertical elevational section illustrating a different embodiment of a modular IBAD system designed for the continuous coating of round stock.
Figure 13:
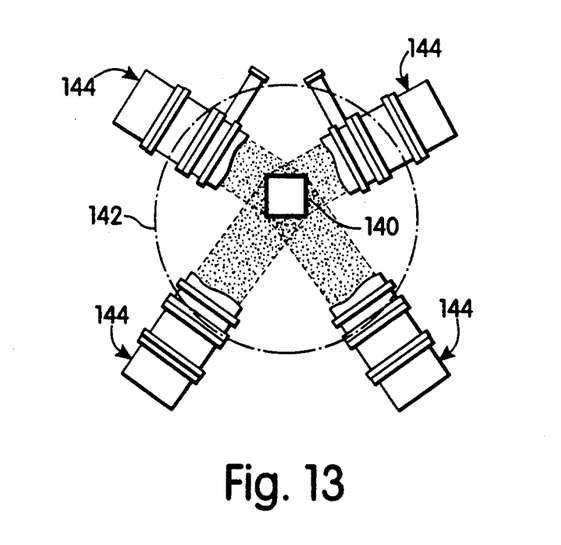
FIG. 13 is a view similar to FIG. 12 but illustrating a further embodiment of a modular IBAD system designed for the continuous coating of a square stock.

As mentioned, the apparatus 10 is designed to coat a wide range of materials, including both metals and plastics, whether in sheet, wire, or rod forms The FIGS. 2-11 illustrate the coating of materials in sheet form, while FIG. 12 illustrates the coating of a wire, tubing, or circular rod, and FIG. 13 illustrates the coating of a square wire or rod.

Also as mentioned, the apparatus 10 can be constructed to be self-contained or the apparatus 10 can be directly incorporated into a raw-material preparing system, such as a foundry designed to produce steel in sheet, wire, or rod form.

Figure 2:
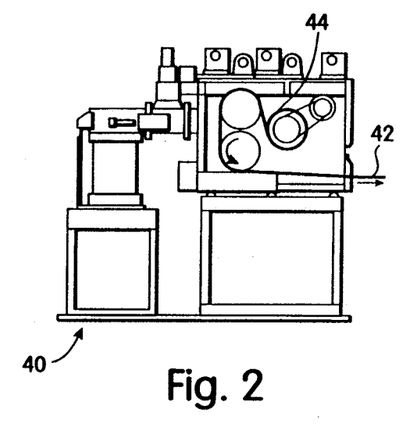
FIG. 2 is a representative preferred material input machine in side elevation.

In FIG. 2 there is illustrated, in side elevation, a representative preferred material input machine 40 designed to feed a material 42 in sheet form into the vacuum entry stage 14. The sheet material 42 to be coated can be plastic or a thin sheet of steel in a thickness ranging from about 0.1 mm to about 3 mm. The sheet material 42 preferably is in a roll form 44 and is introduced into the machine at the beginning of the coating operation. The machine 40 is designed to feed the sheet material 42 at the designated speed, which can range from about 50 meters to about 100 meters per minute.

In instances where the modular IBAD apparatus is to be incorporated directly into an existing raw material production line, such as a foundry, then the material input machine 40 of FIG. 2 is not utilized. Instead, the vacuum entry stage 14 of the apparatus 10 is connected to the foundry at a stage where the sheet of steel to be coated has been formed to the desired dimensions and has the sheet plasticity at the desired temperature not exceeding about 200° C. at the point of entry into the vacuum entry stage 14. The operator of the foundry to which the apparatus 10 is connected will have to resolve the matters relating to the mechanical tolerances regarding the amount of permissible vibration in the sheet material, the accuracy of placement of the sheet material into the vacuum entry stage 14, the uniformity of the sheet's composition, and finally the uniformity of the rate of feed control to match the requirements of the coating to be done in the IBAD apparatus 10 of the invention.

Figure 3:
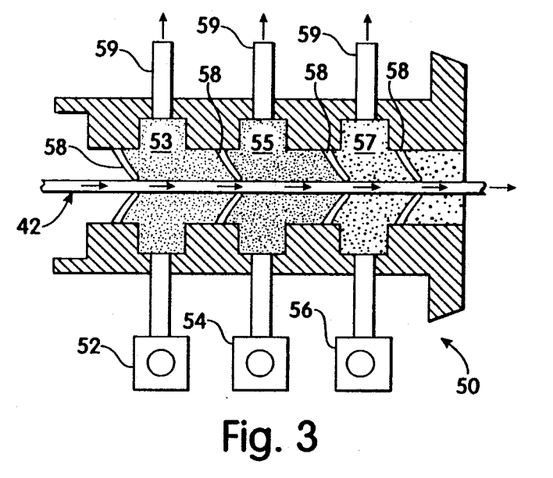
FIG. 3 is a diagrammatic sectional representation of a preferred three-stage vacuum input section.

A preferred vacuum entry stage 50 is illustrated in a diagrammatic vertical section in FIG. 3. Stage 50, as illustrated, is a three-stage differentially pumped high volume unit, with each stage 52, 54, and 56 employing a separate rotary pump and its own roots blower to the atmosphere. The sheet material 42 enters from atmospheric ambient prevailing at the left side in the diagram. A plurality of tynes 58, rolls or other types of sealing devices protrude from the walls of the housing at both the entrance and the exit thereof as well as in between the vacuum transition stages from low, medium, and high as defined and effected by the successive stages 52, 54, and 56. The protruding tynes 58 preferably are flexible and are designed to contact the moving sheet of material 42 to allow for the creation and maintenance of a sucessively higher vacuum differential between the stages 52, 54, and 56. Alternatively, a spring-loaded or otherwise leveraged rolling element (not shown) also can be employed to establish a seal between the stages 52, 54, and 56. Thus, the moving sheet of material 42 passes from atmospheric pressure to a first low vacuum roughing chamber 53, hence to a second medium vacuum roughing chamber 55, and finally to a high vacuum roughing chamber 57, where the vacuum pressure is at least equal to that required in the subsequent material pre- cleaning module 16. The air which has traveled along the surface of the sheet of material 42 is continually being mechanically pumped from the surface thereof and, together with any gaseous effluent present at the sheet's surface, is continuously pumped to the atmosphere, as at 59. Thus, any adsorbed water, water vapor and other vacuum volatile materials are effectively scrubbed from the surface of the sheet of material 42 as it travels through these respective vacuum sub-chambers 53, 55, and 57, before the sheet 42 enters the material pre-cleaning module 16.

Figure 6:
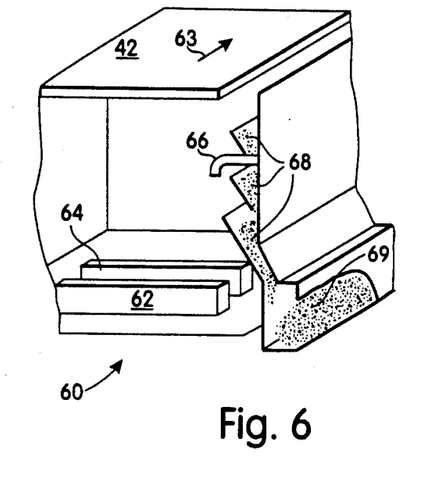
FIG. 6 is a vertical isometric view, partly in section depicting a preferred arrangement for a pre-cleaning module for sheet materials according to the invention.

The sheet of material 42 emerging from the vacuum entry stage 50 passes into a plurality of operational chambers where it will be cleaned and coated, as intended. The sheet of material 42 preferably, first is being cleaned in the material pre-cleaning module 16. A preferred representative pre-cleaning station 60 is illustrated in FIG. 6. Pre-cleaning station 60 is designed to strip the surface intended to be coated of the traveling sheet of material 42 of any organic residues, particulates or oxides To this end, the pre-cleaning station 60 is provided with at least one, and preferably two, ion guns 62 and 64, mounted in tandem along the axial length of movement of the traveling sheet of material 42, as indicated by an arrow 63. The underside surface of the sheet of material 42 is thus effectively pre-cleaned by ion bombardment, that is by sputter cleaning. Depending on the material of the sheet 42, argon ion bombardment is preferred for sheet 42 of steel. The station 60 preferably also is provided with an ion beam monitor 66 and a plurality of collection plates 68 and a receptacle 69 for collecting and containing the removed organic residues, particulates, surface oxides, and any other debris. The resultant atomically cleaned surface of the sheet of material 42 contributes significantly to the quality and density of the coating to be applied thereto as well as to its strong adhesion thereto.

Figure 7:
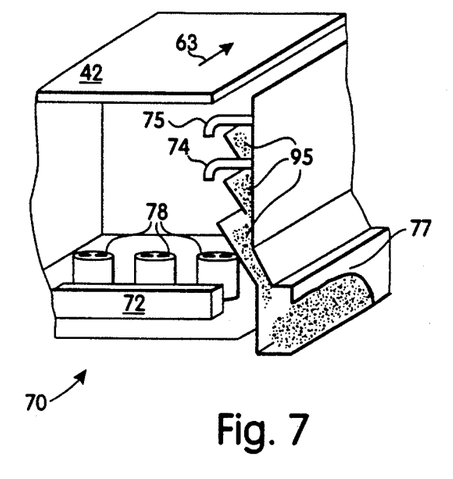
FIG. 7 is a view similar to FIG. 6 but illustrates a preferred arrangement for an IBAD module according to the invention.

The sheet of material 42, with its atomically cleaned underside, is next introduced to the first 18 of a plurality of IBAD modules to be coated according to the invention. One preferred construction of a representative IBAD module 70 is illustrated in FIG. 7, which is a view similar to FIG. 6. In addition to an ion gun 72, an ion beam monitor 74, a plurality of collection plates 76 and a receptacle 77 for any debris collected, module 70 also features a plurality of evaporators 78, tandemly disposed adjacent the ion gun 72. The collection plates 76 preferably, although not necessarily, are electrostatically charged so as to gather debris from the system, generated either by the evaporant or the substrate material. The debris has become charged as a result of exposure to the ion beam. It is to be understood that in the IBAD module 70, both the ion gun 72 and the plurality of evaporators 78 are being targeted at the same segment of the constantly moving sheet of material 42 so as to effect the desired coating thereon in an ion-beam-assisted-deposition as above explained and well understood. That is, in an IBAD system, the physical vapors constantly emanating from the evaporators 78 are not only caused to be deposited and adhered to the targeted surface, herein the underside of the sheet 42, but are also simultaneously being "stitched" thereto; for a similar process see the U.S. Pat. No. 4,743,308 to Sioshansi et al., the disclosure of which is incorporated herein by reference. The IBAD module 70 also preferably is provided with a monitor 75 constantly to gauge the deposition of the film coating on the underside of the traveling sheet 42. Such monitoring by the monitor 75 includes measuring for the thickness, consistency, uniformity, and other desirable qualities of the deposited coating. Both monitors 74 and 75 are in direct communication with the central control 30 whose controller can and does respond instantaneously to initiate corrective measures to rectify any observed deficiencies by either or both monitors 74 and 75. Such corrective measures include, inter alia, speeding up or slowing down the rate of travel of the sheet of material 42 being coated, it being understood that a speed-up will result in a thinner coating being deposited, and a slow-down in a thicker coating being deposited on the sheet 42. Alternatively, the central control 30 also can affect the rate of deposit being generated by the evaporators 78, reducing or increasing thereby the amount of deposit. Preferably, the modular IBAD modules are operable with an ion beam energy of at least about 50 eV, generating a preferred ion fluence of about one ion per 10,000 atoms being deposited, within a range from about 100 to about 100,000 atoms, depending upon film type, and with a current density of about 45 microamps per $cm^2$.

Figure 8:
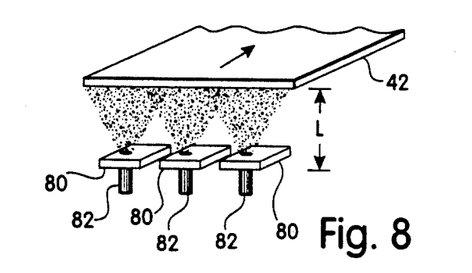
FIG. 8 is a vertical isometric view illustrating a preferred IBAD construction employing a plurality of ion sources and a plurality of evaporator sources, and being independently operable.
Figure 9:
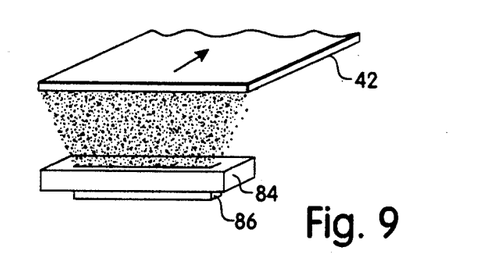
FIG. 9 is a view similar to FIG. 8 but illustrates a linear ion source and a linear evaporator source.

FIGS. 8, 9, and 10 illustrate several preferred arrangements and configurations for ion beam and evaporation systems, in addition to those illustrated in FIGS. 6 and 7.

In FIG. 8 is illustrated an arrangement of multiple independent ion sources 80 and multiple independent evaporator sources 82 of the external feed rod type to effect the dynamic ion beam and physical vapor stream mixing required in an IBAD system. A linear ion source 84, in conjunction with a linear evaporation source 86 of the external plate-fed type is illustrated in FIG. 9. And a two-point evaporator source of the crucible type 90 is illustrated in FIG. 10.

As is well known to those skilled in the art, the thickness of the deposited coating on the traveling sheet of material 42, assuming a classical cosine evaporant distribution, is influenced, in addition to the speed of travel of the sheet 42, by such factors as the distance of separation of the source center lines (see FIG. 10), indicated by an arrow 92, the height "hv" of the sheet 42 above the sources, and "r" representing one-half the distance on the sheet 42 from the centerline between the sources. One preferred width for the sheet of material 42 is about two meters. The separation of the evaporators is determined accordingly, bearing in mind the associated demand for uniformity of deposit.

In each one of the above described embodiments, only one side of the sheet of material 42 is being coated. If coating of both sides thereof is desired, the coated finished roll of sheet 42 is reloaded into the material input machine 40 and the coating process is repeated. In instances where the modular IBAD apparatus 10 has been incorporated into an existing raw material production line, a magnetron-type sputtering system (not shown) can be employed to coat the other surface of the sheet 42 or to coat both surfaces thereof.

A preferred layout for a high vacuum pumping system 100 is illustrated in FIG. 11. A plurality of ion guns 102 and a plurality of evaporators 104 are shown contained within the system 100. Preferably the high vacuum pumping system 100 for use in the modular IBAD coating apparatus 10 is designed to employ a plurality of high capacity diffusion pumps 106 operatively positioned on opposed sides, as shown, of each and every modular unit in the apparatus 10. Each of these diffusion pumps 106 preferably is provided with its own baffle 108 and its own gate valve 109, allowing each one of the pumps 106 to be individually shut down for service, without thereby interrupting the continuity of the coating operation of the apparatus 10. Preferably, the baffles 108 are of the liquid nitrogen ($LN_2$) type. Baffles 108 may not be required for some coating operations, depending on the specific materials to be applied to the sheet 42.

If the primary purpose of the modular IBAD apparatus 10 is to apply a ceramic coating material to a sheet of steel (or steel rod or steel bar stock), a plurality of cryopumps will preferably be substituted for the plurality of diffusion pumps 106, also being individually valved. The use of cryopumps is not only preferred but required in coating runs where air and/or water vapor would pose a serious impediment to film quality and/or adhesion thereof Cryopumps, as known, selectively evacuate air and nitrogen from the system 100 very quickly, and are particularly effective in pumping water vapor. Turbo-molecular pumps also have been investigated. Their use is not advised, however, both because of their cost and their probability of failure being much higher when contrasted with either cryopumps or diffusion pumps 106.

Figure 4:
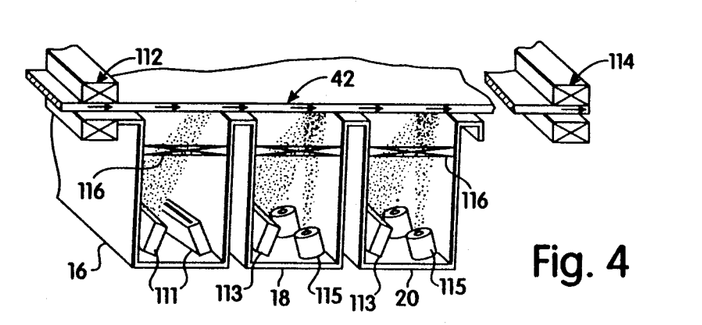
FIG. 4 is a vertical isometric view of a preferred operational layout for the modular pre-cleaning and IBAD modules of the apparatus.

A preferred operational layout 110 for the material pre-cleaning module 16 and the IBAD modules 18 and 20 is illustrated in FIG. 4. This operational stage in the apparatus 10 is appropriately separated from the vacuum entry stage 14 by a vacuum entrance seal 112 and from the vacuum exit stage 24 by a vacuum exit seal 114. The pre-cleaning module 16 features a pair of ion guns 111 and the IBAD modules 18 and 20 each features an ion source 113 and an evaporator source 115. In between the sources 111, 113, and 115 and the traveling sheet of material 42, each of the modules 16, 18, and 20 is provided with an appropriate gate valve 116 to seal off any of the modules requiring repair and/or replacement from the overall high vacuum pumping system 100 provided for each and every modular unit in the apparatus 10. Consequently, the coating apparatus 10 need not be interrupted in its operation.

Our experience indicates that three IBAD modules are more than sufficient for most, if not all, coating operations. However, depending on the desired redundancy, the number of such IBAD modules can be selected to be anywhere between at least two and probably not more than fifty.

The coated sheet of material 42 exiting from the operational stage 110 shown in FIG. 4 first passes through the vacuum exit stage 24 (FIG. 1) and hence into the material output stage 26.

Figure 5:
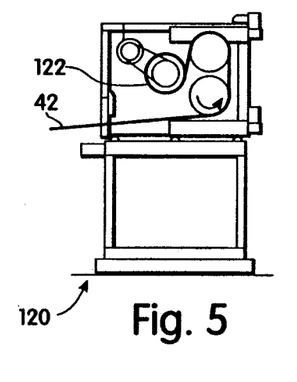
FIG. 5 is a view similar to FIG. 2 and depicts a representative preferred material output machine in side elevation.

A preferred representative material output machine 120 is shown in FIG. 5. It will be observed that output machine 120 is similar to the material input machine 40 in both operation and in construction and it features a take-up roll 122 on which the treated sheet of material 42 is wound. The feed roll 44 and the take-up roll 122 are both identical and exchangeable. Hence, if coating of both sides of the sheet 42 is desired, the take-up roll 122 is placed within the input machine 40, with care being taken that the second time around the heretofore untreated side will be exposed to the coating treatment.

In FIGS. 12 and 13 are illustrated different embodiments in the construction of modular IBAD systems designed for the continuous coating of round stock 130(wire, tubing, etc.) and square stock 140, respectively. Circles 132 and 142 indicate the preferred cross-sectional configuration of the modular material pre-cleaning module and of the respective modular IBAD coating modules, the only difference there between being the addition of evaporators to the ion sources.

In FIG. 12, three combination ion sources and evaporator sources 134 are shown to coat the surface of the traveling round stock 130, which already has been pre-cleaned by a similar arrangement of ion sources, minus the evaporators, in a previous material pre-cleaning module, as above described. The combination ion and evaporator sources 134 are arranged so as to bathe the entire surface of the round stock 130 as it passes through the processing modules. The number of combination sources 134 employed depends, inter alia, on the desired level of redundancy, on the required level of uniformity of adhesion of the coating being applied and or the desired thickness of the applied coating. At least two such sources 134 are required, with the shown number of three sources 134 being preferred.

In FIG. 13, four combination ion and evaporator sources 144 are illustrated for coating the surface of the moving square stock 140. Such a set of four sources 144 provides the operator with the option selectively to engage or disengage one of the four sources 144 to make necessary repairs thereto. Before the coating operation of the square stock 140, the same already has been pre-cleaned by a similar arrangement of at least three, and preferably four, ion sources at a material pre-cleaning module. All other operations with respect to both the round bar stock 130 and the square stock 140 proceed in accord with the elements as described with reference to FIG. 1, physically adapted to handle such configuration of materials.

The modular approach herein allows one to uniquely choose the number of stages and, accordingly, the number of coatings and/or the thickness of the ultimate coating by regulating the deposition to a fine rate for each stage and simply multiplying the number of stages. The advantages of the modular approach are further illustrated in FIGS. 14–17.

Figure 14:
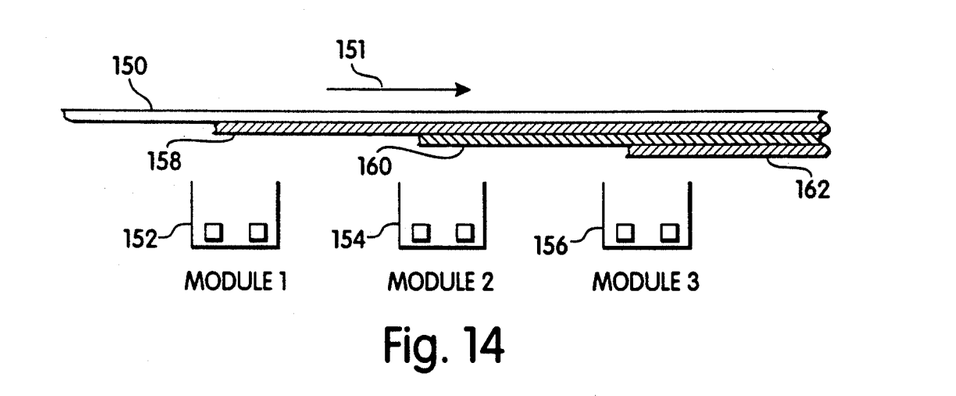
FIG. 14 is a schematic side elevation, partly in section, illustrating the dry-coating of a sheet of material with a plurality of modular IBAD modules according to the invention.

In FIG. 14, the versatility of the modular approach according to the invention is further illustrated in a schematic representation. The schematic representation shows a sheet 150 of material, traveling at a rate of speed, as indicated by an arrow 151, (which can be variable from about 5 meters to about 50 meters according to present technology,) past a plurality of IBAD modules 152, 154, and 156. Each IBAD module 152, 154, and 156 is capable of depositing from about one tenth (1/10) to about fifty (50) microns of a given material at a given speed. Module 152 is shown depositing a first layer 158 of a given material, module 154 a second layer 160 of a given material, and module 156 a third layer 162 of a given material, as illustrated. The deposited materials can be the same or they can differ, and their respective deposited thicknesses also can vary. At least three different resultant dry-coated structures thereof are illustrated in FIGS. 15–17.

Figure 15:
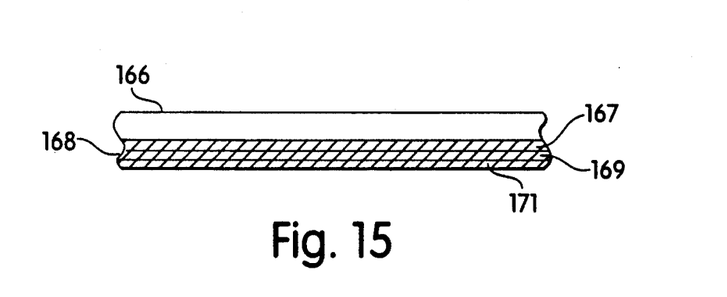
FIG. 15 is a view, partly in section, of a sheet of material dry-coated with a plurality of layers of identical coatings according to the invention.

FIG. 15 shows a sheet 166 of material formed of steel dry-coated according to the invention with a layer 168 of zirconium. The layer 168 of Zr is deposited by successive IBAD modules, as three films 167, 169, and 171 of about two microns each, resulting in the finished layer 168 as being about six microns in thickness.

Figure 16:
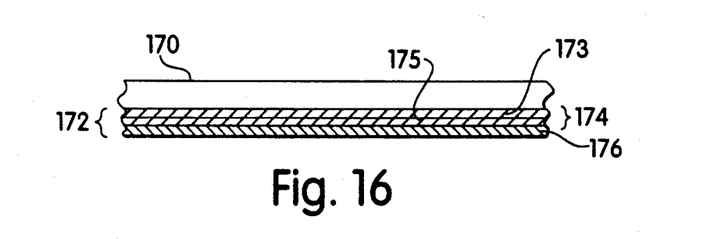
FIG. 16 is a view similar to FIG. 15 but showing a sheet of material dry-coated with a plurality of layers of different coatings of materials and thicknesses.

FIG. 16 illustrates a sheet 170 of material also formed of steel dry-coated according to the invention with a composite layer 172 comprising a chromium layer 174 and a CrN layer 176. The chromium layer 174 is formed of two films 173 and 175, each about 2 microns, and the CrN layer 176 also being about 2 microns, giving an overall thickness to the composite layer 172 of about 6 microns.

Figure 17:
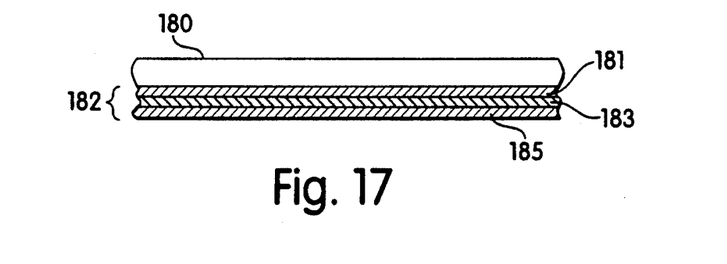
FIG. 17 is a view also similar to FIG. 15 but illustrating a sheet of material dry-coated with a plurality of layers each formed of a different material.

FIG. 17 illustrates a sheet 180 of material also formed of steel dry-coated according to the invention with a composite layer 182 comprising three films 181, 183, and 185, each about two microns thick, giving a combined thickness of about 6 microns to the layer 182. Each film is composed of different materials, however. Film 181 adjacent the sheet 180 of steel is formed of aluminum, film 183 in the middle is formed of $Al_2O_3$, and film 185 on the outside is formed of platinum.

EXAMPLE I

A low carbon (carbon content ranging between about 0.002 and about 0.09 percent) steel sheet, 2 meter wide and about 0.011 inch thick, is coated with zinc, traveling at a speed of about 50 meters per minute through the modular IBAD apparatus 10 of the invention, with the following additional operational parameters:

| | |
|---|---|
| Thickness of Zinc Coating: | about 5 microns |
| Temperature of Steel Sheet at Coating (achieved via argon ion bombardment in the material pre-cleaning module 16): | about 100° C. |
| Deposition rate of Zinc: | about 500,000 Angstroms/minute |
| Vacuum Pressure in the System 100: | about $10^{-5}$ torr |
| Duration of Exposure: | about 6 seconds |

EXAMPLE II

A cold rolled steel sheet, 2 meters wide and about 1 mm thick, is coated with cadmium, traveling at a speed of about 50 meters per minute through the modular IBAD apparatus 10 of the invention, with the following additional operational parameters:

| | |
|---|---|
| Thickness of Cadmium coating: | about 10 microns |
| Temperature of Steel Sheet at Coating: | about 100° C. |
| Deposition Rate of Cadmium: | about 800,000 Angstroms/minute |
| Vacuum Pressure in the System 100: | about $10^{-5}$ torr |
| Duration of Exposure: | about 7 seconds |

EXAMPLE III

A cold rolled steel sheet, 2 meters wide and about 0.1 mm thick is coated with tin, traveling at a speed of about 50 meters per minute through the modular IBAD apparatus 10 of the invention, with the following additional operational parameters:

| | |
|---|---|
| Thickness of Tin Coating: | about 3 microns |
| Temperature of Steel Sheet at Coating: | about 150° C. |
| Deposition Rate of Tin: | about 300,000 Angstroms/minute |
| Vacuum Pressure in the System 100: | about $10^{-5}$ torr |
| Duration of Exposure: | about 6 seconds |

EXAMPLE IV

A cold rolled steel round bar stock with a diameter of one inch is coated with zirconia to give it a pinkish red coloration, traveling at a speed of about 50 meters per minute through the modular IBAD apparatus 10 of the invention, with the following additional operational parameters:

| | |
|---|---|
| Thickness of Zirconia Coating: | about 1 microns |
| Temperature of Stel Bar at Coating: | about 100° C. |
| Deposition Rate of Zirconia: | about 200,000 Angstroms/minute |
| Vacuum Pressure: | about $10^{-6}$ torr |
| Duration of Exposure: | about 3 seconds |

EXAMPLE V

A cold rolled steel square bar stock with a size of 1"×1", is coated with chrome, traveling at a speed of about five (5) meters per minute through the modular IBAD apparatus 10 of the invention, with the following additional operational parameters:

| | |
|---|---|
| Thickness of Chrome Coating: | about 5 microns |
| Coating Temperature | about 250° C. |
| Deposition Rate of Chrome: | about 100,000 Angstroms/minute |
| Vacuum Pressure: | about $10^{-5}$ torr |

EXAMPLE VI

A flat low carbon steel sheet is coated successively with chrome and $Al_2O_3$, traveling at a speed of about ten (10) meters per minute through the modular IBAD apparatus 10 of the invention, with the following additional operational parameters:

| | |
|---|---|
| Coating Thickness: | Cr - about 2 microns<br>$Al_2O_3$ - about 0.5 microns |
| Coating Temperature: | about 200° C. |
| Deposition Rates: | Cr - about 100,000 A/min<br>$Al_2O_3$ - about 50,000 A/min |
| Vacuum Pressure: | about $10^{-5}$ torr |
| Duration of Exposure: | about 8 seconds |

EXAMPLE VII

A flat sheet of low carbon steel is simultaneously coated with Fe and Zinc in the presence of the ion beam at a speed of 50 meters per minute through the modular IBAD apparatus 10 of the invention, with the following additional parameters:

| | |
|---|---|
| Coating Thickness | Zn—Fe Alloy - about 5 microns |
| Coating Temperature: | about 200° C. |
| Deposition Rate: | about 500,000 A/min |
| Vacuum Pressure: | about $10^{-5}$ torr |
| Duration of Exposure: | about 10 seconds |

Thus it has been shown and described a modular ion-beam-assisted deposition apparatus 10 for continuous coating of a wide range of materials, which apparatus 10 satisfies the objects and advantages set forth above.

Since certain changes may be made in the present disclosure without departing from the scope of the present invention, it is intended that all matter described in the foregoing specification or shown in the accompanying drawings, be interpreted in an illustrative and not limiting sense.

What is claimed is:

1. Modular continuous coating apparatus comprising:
   (a) a material input section;
   (b) a modular vacuum entry stage operatively coupled to said material input section;
   (c) a modular material pre-cleaning module coupled to said vacuum entry stage;

(d) a plurality of modular IBAD modules couple to said material pre-cleaning module;

(e) a modular vacuum exit stage coupled to said plurality of IBAD modules; and (f) a material output section coupled to said vacuum exit stage;

(g) each of said plurality of modular IBAD modules comprising an ion source and an evaporator.

2. The apparatus of claim 1 wherein said material input and output sections each comprises a feed reel mechanism, and wherein said material input section comprises an intermediate production stage of the material being fed by said material input section.

3. The apparatus of claim 1 wherein said modular vacuum entry stage comprises a multi-stage differentially pumped unit.

4. The apparatus of claim 3 wherein said multi-stage differentially pumped unit comprises a plurality of rotary vacuum pumps, each provided with a roots blower.

5. The apparatus of claim 1 wherein said modular material pre-cleaning module includes a plurality of ion sources.

6. The apparatus of claim 5 wherein said plurality of ion sources comprises at least a pair of individually operable linear ion sources.

7. The apparatus of claim 5 wherein said plurality of ion sources comprises at least a pair of independently operable multiple ion sources.

8. The apparatus of claim 1 wherein both said ion source and said evaporator comprise more than one source and more than one evaporator each, each being independently operable.

9. The apparatus of claim 1 wherein both said ion source and said evaporator comprise a linear ion source and a linear evaporator.

10. The apparatus of claim 1 wherein said ion source is a linear source and said evaporator is of a multiple kind.

11. The apparatus of claim 10 wherein said evaporator is a two-point source crucible evaporator.

12. The apparatus of claim 1 in which said apparatus includes a high vacuum pumping system comprising a plurality of pumps, with each pump being individually valved to the system and including its own gate valve.

13. The apparatus of claim 12 wherein each pump of said pumping system further includes a liquid nitrogen baffle mounted between said gate valve and said pump.

14. The apparatus of claim 12 wherein each pump of said pumping system is a diffusion pump.

15. The apparatus of claim 12 wherein each pump of said pumping system is a cryopump.

16. The apparatus of claim 1 wherein said modular vacuum exit stage comprises a multi-stage differentially pumped unit.

17. The apparatus of claim 1 wherein said material pre-cleaning module and said plurality of IBAD modules are circumferentially arranged.

18. The apparatus of claim 1 which is capable of processing a sheet, wire, or tubing of material at a rate of about 50 meters per minute with a coating deposition rate from about 100,000 Angstroms to about 800,000 Angstroms per minute.

19. The apparatus of claim 18 wherein said plurality of modular IBAD modules are designed to coat said sheet, wire, or tubing of material with a coating thickness from about one tenth (1/10) to about fifty microns.

20. The apparatus of claim 19 wherein each of said plurality of modular IBAD modules is operable with an ion beam energy of at least about 50 eV, generating an ion fluence of about one ion per 1,000 atoms being deposited.

21. The apparatus of claim 1 further including a central control station, support facilities, and power supplies individually coupled to each and every operational element of said apparatus.

22. The apparatus of claim 21 wherein said support facilities include a plurality of compressors, water cooling, purification, and filtration systems.

23. A continuous coating apparatus comprising:

(a) a phased entry stage for the material to be coated in said apparatus;

(b) a pre-cleaning stage coupled to said entry stage to atomically clean the surface of said material to be coated;

(c) an IBAD coating stage coupled to said pre-cleaning stage and comprising of at least one IBAD module;

(d) a phased exit stage coupled to said IBAD coating stage for said coated material;

(e) each of said stages being modular in construction;

(f) a high vacuum pumping system operatively and individually coupled to each of said stages thereof;

(g) a central control operatively and individually coupled to each of said stages thereof; and (h) a power supply operatively and individually coupled to each of said stages thereof.

24. The continuous coating apparatus of claim 23 wherein said pumping system comprises a plurality of pumps, each being individually coupled to said apparatus and comprising of one of a group consisting of diffusion pumps and cryopumps.

25. The continuous coating apparatus of claim 23 wherein said phased entry stage comprises a multi-stage differentially pumped unit to achieve a transition stage for said material from atmospheric pressure to the required vacuum pressure within said apparatus.

26. The continuous coating apparatus of claim 23 wherein said pre-cleaning stage comprises at least one ion source, and wherein said IBAD module comprises at least one ion source and one evaporator source, both directed at the same segment of said material as it is being continuously transported through said apparatus.

27. The continuous coating apparatus of claim 26 wherein said central control includes a microprocessor both to gauge the speed of travel of said material through said apparatus and to convert said speed of travel into the required operational parameters for operating said stages to achieve the deposition of a predetermined coating on said material.

* * * * *